(12) United States Patent
Inoue et al.

(10) Patent No.: US 8,529,739 B2
(45) Date of Patent: Sep. 10, 2013

(54) INDIUM OXIDE-CERIUM OXIDE BASED SPUTTERING TARGET, TRANSPARENT ELECTROCONDUCTIVE FILM, AND PROCESS FOR PRODUCING A TRANSPARENT ELECTROCONDUCTIVE FILM

(75) Inventors: Kazuyoshi Inoue, Chiba (JP); Masato Matsubara, Chiba (JP); Shigekazu Tomai, Chiba (JP)

(73) Assignee: Idemitsu Kosan Co., Ltd, Tokyo (JP)

(*) Notice: Subject to any disclaimer, the term of this patent is extended or adjusted under 35 U.S.C. 154(b) by 2039 days.

(21) Appl. No.: 10/594,756

(22) PCT Filed: Feb. 21, 2005

(86) PCT No.: PCT/JP2005/002705
§ 371 (c)(1),
(2), (4) Date: Sep. 29, 2006

(87) PCT Pub. No.: WO2005/098080
PCT Pub. Date: Oct. 20, 2005

(65) Prior Publication Data
US 2007/0209928 A1 Sep. 13, 2007

(30) Foreign Application Priority Data
Mar. 31, 2004 (JP) .................................. 2004-105581

(51) Int. Cl.
C25B 9/00 (2006.01)
C25B 11/00 (2006.01)
C25B 13/00 (2006.01)
C23C 14/00 (2006.01)
B32B 15/00 (2006.01)
B32B 17/06 (2006.01)
B32B 9/00 (2006.01)
B32B 15/04 (2006.01)
B32B 19/00 (2006.01)

(52) U.S. Cl.
USPC ............... 204/298.13; 204/298.12; 428/432; 428/469; 428/697; 428/701; 428/702

(58) Field of Classification Search
USPC ............... 204/298.01; 428/432, 469, 702, 428/697, 701
See application file for complete search history.

(56) References Cited

U.S. PATENT DOCUMENTS
6,905,776 B1 6/2005 Stollenwerk et al.
2004/0081836 A1 4/2004 Inoue
(Continued)

FOREIGN PATENT DOCUMENTS
DE 19948839 A1 4/2001
JP 3-043911 A 2/1991
(Continued)

OTHER PUBLICATIONS

Bhosale, A.K.. Effective utilization of spray pyrolyzed CeO2 as optically passive counter electrode for enhancing optical modulation of WO3. Solid State Ionics [online] [Accessed [Jul. 16, 2010] [http://www.sciencedirect.com/science?_ob=ArticleURL&_udi=B6TY4-4X0MP6R-1&_user=2502287&_coverDate=10%2F05%2 F2009&_rdoc=1&_fmt=high&_orig=search&_sort=d&_docan.*
(Continued)

*Primary Examiner* — Michael Band
(74) *Attorney, Agent, or Firm* — Millen, White, Zelano & Branigan, P.C.

(57) ABSTRACT

A transparent conductive film for constructing a transparent electrode that is free from the generation of residue, etc. by etching with a weak acid (for example, organic acid). Further, there is provided a sputtering target for producing the transparent conductive film. In particular, there is provided a sputtering target composed of indium oxide and cerium oxide, characterized in that in the observation of crystal peaks by X-ray diffractometry, the presence of peaks ascribed to indium oxide and cerium oxide is observed, and that in the EPMA measurement, the diameter of cerium oxide particles dispersed in indium oxide is measured as being $\leq 5$ µm. A transparent conductive film is formed by a sputtering technique with the use of this sputtering target. This transparent conductive film is substantially free from the generation of residue, etc. by etching with a weak acid (for example, organic acid).

3 Claims, 1 Drawing Sheet

|  | Example 1 | Example 2 | Example 3 | Comparative Example 1 | Comparative Example 2 | Comparative Example 3 |
|---|---|---|---|---|---|---|
| (Sputtering target) |  |  |  |  |  |  |
| [Ce]/[In] | 0.012 | 0.035 | 0.07 | 0.0005 | 0.18 | 0.10 ([Sn]/[In]) |
| Bulk resistance (mΩcm) | 0.95 | 0.84 | 0.82 | 10.5 | 8.35 | 0.35 |
| Density (g/cc) | 6.6 | 6.8 | 6.9 | 6.4 | 7.0 | 6.8 |
| Particle diameter (µm) | 2.8 | 2.4 | 4.8 | ---- | ---- | ---- |
| (Transparent electroconductive film) |  |  |  |  |  |  |
| Light transmittance (%) | 91 | 90 | 89 | 89 | 87 | 90 |
| Specific resistance before heating (µΩcm) | 360 | 330 | 380 | 450 | 1250 | 230 |
| Standard electrode potential before heating (V) | 0.38 | 0.36 | 0.37 | 0.80 | 0.7 | 0.83 |
| Specific resistance after heating (µΩcm) | 220 | 210 | 250 | 870 | 1860 | 180 |
| Standard electrode potential after heating (V) | 0.36 | 0.35 | 0.38 | 0.86 | 0.76 | 0.86 |
| Abundance of trivalent cerium | 0.15 | 0.24 | 0.36 | ---- | ---- | ---- |

(56) References Cited

U.S. PATENT DOCUMENTS

| | | |
|---|---|---|
| 2004/0169799 A1 | 9/2004 | Hanakawa et al. |
| 2004/0180217 A1 | 9/2004 | Inoue et al. |
| 2006/0049410 A1 * | 3/2006 | Hosokawa et al. ............. 257/79 |
| 2006/0234088 A1 | 10/2006 | Inoue et al. |

FOREIGN PATENT DOCUMENTS

| | | |
|---|---|---|
| JP | 07-054133 A | 2/1995 |
| JP | 08-260134 A | 10/1996 |
| JP | 09-176841 A | 7/1997 |
| JP | 9-176841 A | 7/1997 |
| JP | 9176841 A | 7/1997 |
| JP | 2001-011613 A2 | 1/2001 |
| JP | 2001-305529 A2 | 10/2001 |
| JP | 2002-049033 A2 | 2/2002 |
| JP | 2002-049034 A2 | 2/2002 |
| JP | 2003-105532 A | 4/2003 |
| JP | 2003105532 A | 4/2003 |
| JP | 2004068054 A | 3/2004 |
| WO | WO 03/014409 A | 2/2003 |
| WO | WO-2004 017137 | 2/2004 |
| WO | WO 2004017137 A1 * | 2/2004 |

OTHER PUBLICATIONS http://webelements.com/cerium/chemistry.html [Accessed on Jul. 15, 2010].* http://en.wikipedia.org/wiki/Cerium(IV)_oxide [Accessed on Jul. 15, 2010].*

* cited by examiner

| | Example 1 | Example 2 | Example 3 | Comparative Example 1 | Comparative Example 2 | Comparative Example 3 |
|---|---|---|---|---|---|---|
| (Sputtering target) | | | | | | |
| [Ce]/[In] | 0.012 | 0.035 | 0.07 | 0.0005 | 0.18 | 0.10 ([Sn]/[In]) |
| Bulk resistance (mΩcm) | 0.95 | 0.84 | 0.82 | 10.5 | 8.35 | 0.35 |
| Density (g/cc) | 6.6 | 6.8 | 6.9 | 6.4 | 7.0 | 6.8 |
| Particle diameter (μm) | 2.8 | 2.4 | 4.8 | ---- | ---- | ---- |
| (Transparent electroconductive film) | | | | | | |
| Light transmittance (%) | 91 | 90 | 89 | 89 | 87 | 90 |
| Specific resistance before heating (μΩcm) | 360 | 330 | 380 | 450 | 1250 | 230 |
| Standard electrode potential before heating (V) | 0.38 | 0.36 | 0.37 | 0.80 | 0.7 | 0.83 |
| Specific resistance after heating (μΩcm) | 220 | 210 | 250 | 870 | 1860 | 180 |
| Standard electrode potential after heating (V) | 0.36 | 0.35 | 0.38 | 0.86 | 0.76 | 0.86 |
| Abundance of trivalent cerium | 0.15 | 0.24 | 0.36 | ---- | ---- | ---- |

INDIUM OXIDE-CERIUM OXIDE BASED SPUTTERING TARGET, TRANSPARENT ELECTROCONDUCTIVE FILM, AND PROCESS FOR PRODUCING A TRANSPARENT ELECTROCONDUCTIVE FILM

BACKGROUND ART

The invention relates to a sputtering target for producing an electrode substrate for driving liquid crystal, an electrode substrate for EL, or the like. The invention also relates to a transparent electroconductive film produced by use of the sputtering target, and a process for producing a transparent electroconductive film, using the sputtering target.

BACKGROUND ART

Technical Background

Hitherto, materials doped with Sn have been investigated for a sputtering target for transparent electroconductive films. In particular, ITO (indium tin oxide) has widely been used.

However, it is necessary to crystallize ITO in order to make the specific resistance of ITO low. It is therefore necessary to form ITO into a film at high temperature, or conduct predetermined thermal treatment after ITO is formed into a film.

For etching process of a crystallized ITO film, aqua regia (a mixed solution of nitric acid and hydrochloric acid), which is a strong acid, is used. However, the occurrence of the inconveniences due to the use of the strong acid may be problematic. In other words, in a liquid crystal display device wherein constituents such as TFTs (thin film transistors) are used, metallic thin lines may be used for a gate line, or source/drain lines (or electrodes); at the time of etching the ITO film with aqua regia, there may be caused problems that the lines made of these wiring materials are broken, or become thin.

Thus, suggested is a method of forming a film of amorphous ITO in the presence of hydrogen or water in sputtering target gas when the film is formed, and then etching this amorphous ITO with a weak acid. However, ITO itself is crystalline so as to cause a problem that etching residues are generated. When the film is formed, projections called nodules may be generated on the ITO sputtering target if hydrogen or water is dispersed in the sputtering gas. The projections may cause abnormal discharge.

Prior Art Wherein Ce is Added

As patents about a sputtering target, an electroconductive material and a transparent electroconductive film wherein Ce is added, Patent Documents 1 and 2 that will be described later are disclosed. According to, for example, Patent Document 1, it is stated that the addition of Ce gives a transparent electroconductive film having a lower resistance.

However, according to these disclosed Patent Documents 1 to 6, it is difficult to obtain a target wherein no nodules are generated.

Semi-Transmissible and Semi-Reflective Liquid Crystal

In the meantime, semi-transmissible and semi-reflective liquid crystals have been eagerly researched and developed for the following reasons.

(1) Since the liquid crystals are semi-transmissible and semi-reflective, bright display can be obtained whether the liquid crystals are present outdoors or indoors.

(2) When the liquid crystals are used in a bright place, the liquid crystals can be used as reflective liquid crystals Thus, power consumption can be saved.

(3) Since the liquid crystals are excellent in low power consumption property, the liquid crystals are suitable for portable displays.

(4) Full-color display can easily be obtained.

However, about the semi-transmissible and semi-reflective liquid crystals, it is necessary to set a reflective electrode and a transmissible electrode inside the same pixel in electrode sections for driving the liquid crystals. Thus, the producing process thereof becomes complicated, and problems as follows are pointed out:

The yield falls.

Costs increase.

The manners that a display is viewed in transmissible and reflective modes are different, so that displays are not easy to view.

Thus, in Patent Document 7 or 8 that will be described later, a structure is adopted wherein a silver reflecting film is formed, the film is then covered with a protecting film, and transparent electrodes for driving liquid crystals are disposed thereon. The silver reflecting layers and the transparent electrodes are alternately arranged, thereby forming a semi-transmissible and semi-reflective liquid crystal driving electrode.

Patent Document 7 or 8 states that a fall in the reflectivity of the silver reflecting film beneath the protecting film can be prevented by subjecting the protecting film to heating treatment.

In Patent Document 9 that will be described later, a semi-transmissible and semi-reflective film is formed, and further a Si thin film or the like that has an auxiliary reflecting function is arranged. This Patent Document 9 states that the color tone of a display device can be adjusted into a desired color tone by the auxiliary thin film.

Patent Document 1: Japanese Patent Application Laid-Open (JP-A) No. 3-43911, "Transparent Electroconductive Film", Patent Document 2: (JP-A) No. 7-54133, "ITO Target for Sputtering target", Patent Document 3: (JP-A) No. 8-260134, "Sputtering Target", Patent Document 4: (JP-A) No. 9-176841, "Sputtering Target", Patent Document 5: (JP-A) No. 2001-11613, "Process for Producing a Sputtering Target Containing Zinc Oxide", Patent Document 6: (JP-A) No. 2003-105532, "Sputtering Target, and Process for Producing the Same", Patent Document 7: (JP-A) No. 2002-49034, Patent Document 8: (JP-A) No. 2002-49033, and Patent Document 9: (JP-A) No. 2001-305529.

DISCLOSURE OF THE INVENTION

Problems to be Solved by the Invention

However, according to the above-mentioned patent documents, it is necessary to etch their transmissible electrode section and their reflective electrode section separately. That is, it is necessary to perform film formation and etching for each layer. In other words, treatments are repeated as follows: "Film formation-Etching by photolithography—Film formation—Etching by photolithography".

Both of the transparent electrode and the reflective electrode are electrodes for the same pixel. Thus, naturally, they are electrically connected to each other. Accordingly, at the time of the above-mentioned treatments, cell reaction is generated by action of a developing solution, an etchant or a releasing agent used when these electrode layers (the transparent electrode and the reflective electrode) are etched, so that the reflective electrode may be locally corroded. Specifically, the etchant or the like becomes an electrolyte of a cell, and the transparent electrode and the reflective electrode unfavorably constitute two electrodes of the cell.

In the case of adopting a structure having a reflective electrode on a transparent electrode, it is feared that when the reflective electrode is etched, the transparent electrode beneath the reflective electrode is damaged. As a transparent electrode that is generally used, in particular, ITO (indium tin oxide) can be exemplified. When this ITO contacts aluminum, a problem that cell reaction is easily caused arises. As a result, in the case of using aluminum to make a reflective electrode, this cell reaction is easily generated.

Crystalline ITO has a problem that the ITO cannot be etched as long as a strong acid such as aqua regia or hydrochloric acid is not used, and corrodes, for example, wiring material of TFTs connected to the electrode.

In the meantime, about amorphous ITO, problems as described below are known.

A decline in the adhesive property thereof to an underlying substrate is observed.

The contact resistance with, for example, TFT wiring material increases.

When the ITO is etched, residues are generated.

A short circuit between the electrodes.

Driving failure and other troubles are generated at the time of driving a liquid crystal.

The standard electrode potential of an ITO thin film measured in an Al etchant (a mixed acid made of phosphoric acid, acetic acid and nitric acid) to a Ag/AgCl electrode is 0.80 V. Similarly, the standard electrode potentials of Al and Al—Nd to a Ag/AgCl electrode are −0.41 V and −0.54 V, respectively. As a result, when Al and ITO are present in an Al etchant, which is an electrolyte, in a state that Al and ITO electrically contact each other, a phenomenon that Al is dissolved by cell reaction is caused. As a result, wiring lines of Al may be broken or "line-thinning" may be caused. IZO (indium zinc oxide, "IZO" is a registered trade name) is devised as an amorphous material. This material has a nature that the material is dissolved in an etchant for aluminum also, and thus the use of IZO is difficult in the case of adopting a structure having a reflective electrode on a transparent electrode.

In view of the above-mentioned problems, the invention has been made. An object of the invention is to provide a transparent electroconductive film, which constitutes a transparent electrode wherein residues and the like, are not generated by etching with a weak acid (such as an organic acid), and provide a sputtering target for producing this transparent electroconductive film.

Another object of the invention is to provide a transparent electroconductive film which constitutes a transparent electrode having resistance against an etchant for a reflective electrode over a transparent electrode when the reflective electrode is etched, and provide a sputtering target for producing this transparent electroconductive film.

A further object of the invention is to provide a transparent electroconductive film which constitutes a transparent electrode capable of restraining cell reaction resulting from a matter that the electrode is electrically connected to a reflective electrode when the reflective electrode over the transparent electrode is etched, and provide a sputtering target for producing this transparent electroconductive film.

Means for Solving the Problems (1) In order to solve the above-mentioned problems, the invention is a sputtering target comprising indium oxide and cerium oxide, wherein when its crystal peaks are observed by x-ray diffraction, the presence of peaks originating from indium oxide and cerium oxide is observed, and further when EPMA measurement is performed, the measured diameter of particles of cerium oxide dispersed in indium oxide is 5 μm or less.

In the case where the sputtering target, to which cerium oxide alone is added, is used to perform sputtering, an amorphous film can be formed when the temperature of a substrate on which the film is to be formed is from R.T. (room temperature) to 200° C.

As will described later, this amorphous film can be crystallized by subjecting the film to thermal treatment at 200° C. or higher after the formation of the film.

In the invention, phenomena described below can be observed in the case where no peak originating from cerium oxide is present or the particle diameter of cerium oxide measured with an EPMA (electron probe micro analyzer) is more than 5 μm:

Abnormal discharge is generated.

In the case where crystalline particles are present in a transparent electroconductive film while the film is formed, residues are generated when the film is subjected to etching working.

The amorphous film is not crystallized even by heating treatment at 200° C. or higher (this will be again detailed later).

(2) The invention is the sputtering target according to the above-mentioned item [1], wherein when the EPMA measurement is performed, the presence of the cerium oxide particles, which are cerium oxide particles, dispersed in indium oxide and have a diameter of 1 μm or more is observed.

In the invention of the item [1], the particle diameter of cerium oxide according to the EPMA measurement is 5 μm or less, as described above. The particle diameter is more preferably from 1 to 3 μm. However, in a completely dispersed state (in the case where only cerium oxide of 1 μm or less size is present), indium oxide may grow abnormally. This completely dispersed state may cause abnormal discharge. Furthermore, this completely dispersed state may cause etching residues when a film is formed by sputtering and then the thin film is etched. Therefore, the invention is characterized in that particles having at least 1 μm or more are present.

(3) The invention is also the sputtering target according to the item (1) or (2), comprising indium oxide and cerium oxide, wherein [Ce]/([In]+[Ce])=0.005 to 0.15.

As described above, in the invention, the adopted composition of cerium is a composition wherein [Ce]/([In]+[Ce])= 0.005 to 0.15. Herein, [Ce] represents the number of the atoms of cerium per unit weight/unit volume, and [In] represents the number of the atoms of indium per unit weight/unit volume. In other words, [Ce]/([In]+[Ce]) represents the atomic composition ratio of the cerium atoms in the sputtering target.

In the invention, the value of this expression is a number in the range of 0.005 to 0.15, as described above. This value is preferably from 0.01 to 0.1, more preferably from 0.01 to 0.05.

If the value of this expression is 0.005 or smaller, a completely dispersed state is generated so that abnormal grow of indium oxide may be generated. In short, this completely dispersed state may cause abnormal discharge. Additionally, in the case where a film is formed at a substrate temperature of 150° C. or lower, crystallization of the film may advance immediately after the formation of the film. In the case where this crystallization advances, etching residues may be generated when etching is performed.

If the value of this expression is more than 0.15, the particle diameter of cerium oxide becomes more than 5 μm so that abnormal discharge may be generated. Additionally, the particles may not be crystallized even if the particles are heated at 200° C.

(4) The invention is also the sputtering target according to any one of the items (1) to (3) comprising indium oxide and cerium oxide, and having a density of 6.6 or more and a bulk resistance of 1 mΩcm or less.

As described above, the density is preferably 6.6 g/cc or more, more preferably 6.7 g/cc or less, even more preferably 6.8 g/cc or more. The bulk resistance is 1 mΩcm or less in the invention, as described above. The resistance is more preferably 0.9 mΩcm or less.

If the density of the sputtering target is less than 6.6 gΩcm, the bulk resistance also becomes more than 1 mΩcm so that abnormal discharge may be generated. Abnormal discharge may be generated in the same manner even if the bulk resistance is more than 1 mΩcm.

(5) The invention is also the sputtering target according to any one of the items (1) to (5), comprising indium oxide and cerium oxide, and comprising cerium oxide the valence of which is positive trivalent.

When the valence of cerium is positive trivalent as described above, the dispersibility of the cerium atoms in the target can be controlled. Accordingly, the bulk resistance of the sputtering target becomes 1 mΩcm or less. As a result, the sputtering target becomes a sputtering target wherein abnormal discharge is not easily generated. The sputtering target can be used industrially usefully.

The abundance (presence ratio) of the trivalent cerium is preferably from 0.01 to 0.6, more preferably from 0.01 to 0.4, even more preferably from 0.05 to 0.4. If the abundance of the trivalent cerium is less than 0.01, the dispersibility of the cerium atoms may not be controlled with ease. On the other hand, if the abundance is more than 0.6, abnormal dispersion may be caused. This may cause abnormal discharge in sputtering.

(6) The invention is also a transparent electroconductive film formed by sputtering using a sputtering target according to any one of the items (1) to (5), the specific resistance of the film being less than 600 μΩcm.

In particular, when the sputtering target according to the item (5) is used, positive trivalent cerium is contained in a thin film also, whereby the dispersibility is improved so that an improvement in the electroconductivity (a decrease in the specific resistance) can be realized. In short, a transparent electroconductive film having a low resistance can be obtained. As a method for detecting this positive trivalent cerium, there can be used XPS (X-ray photoelectron spectroscopy), or a detecting method using high-luminance radiated light or the like.

(7) The invention is also the transparent electroconductive film according to the item (6), which is heated in a temperature range of 200 to 250° C., so as to be crystallized.

The transparent electroconductive film of the item (6) is amorphous when or after the film is formed. However, by heating this, the film can be crystallized.

The matter that the film is amorphous when or after the film is formed is preferably known by, for example, X-ray diffraction.

Film Forming Temperature

In the case of using the sputtering target of any one of the items (1) to (5) to form a film, judgment from results of X-ray diffraction thereof demonstrates that an amorphous transparent electroconductive film is obtained when the film forming temperature is from room temperature to lower than 200° C. In the case where the film forming temperature is room temperature or lower, costs are necessary for cooling. Thus, the case is practically meaningless. In the case where the film forming temperature is 200° C. or higher, the film may be crystallized so that residues may be generated when the film is etched.

The range of the film forming temperature is preferably from 50 to less than 180° C., more preferably from 100 to 180° C. When a film is formed within such a temperature range, the formed transparent electroconductive film will be crystallized by subsequent heating in a temperature range of 200 to 250° C.

Heating after the Film Formation

As described above, in the invention, after the formation of the film, the film is heated within a temperature range of 200 to 250° C., thereby crystallizing the film.

If the heating temperature is lower than 200° C. at this time, the rate of the crystallization (the rate at which the film is being crystallized) may be slow so that the time for the crystallizing treatment may become excessively large.

On the other hand, if the heating temperature is 250° C. or higher, costs required for the heating may increase. Furthermore, an effect may be produced onto an underlying member such as a TFT substrate.

As described above, in the invention, the transparent electroconductive film is heated, thereby being crystallized. This crystallization makes it possible to cause this transparent electroconductive film to have resistance against an aqueous solution of oxalic acid, a mixed acid of phosphoric acid, acetic acid and nitric acid, or an etchant solution containing cerium ammonium nitrate.

The case of causing the film to have such resistance means that the film has resistance against etchants for a reflective film formed on the transparent electroconductive film and made of Al, Ag or the like, for Al, which is a source/drain wiring in a TFT array, and for wiring made of Cr, Mo, Ag or the like. Accordingly, at the time of forming the reflective film or wiring also, the transparent electroconductive film of the invention is not damaged. Thus, this matter is useful for producing the reflective film or the like.

The temperature range of the heating treatment in the invention is preferably a temperature range of 210 to 250° C., more preferably a temperature range of 220 to 240° C.

(8) The invention is also the transparent electroconductive film according to any one of the items (6) to (7), wherein the standard electrode voltage to Ag/AgCl is 0.6 V or less.

As described above, according to the invention, the standard electrode potential is low; therefore, this transparent electroconductive film can be etched without giving any damage to Al as an electrically connected reflective film, or Al, Mo or Cr wiring or electrodes used in a TFT array.

If the standard electrode potential is more than 0.6 V, cell reaction is easily caused, and a local voltage generated herein becomes large so that a large damage gives to Al as a reflective film in many cases. In the case where a TFT array is set up as a driving element such as a liquid crystal, a large damage is given to the Al, Mo or Cr wiring or electrodes used in the TFT array in many cases. As a result, the following possibility becomes high: the possibility that the reflective film or the wiring is deteriorated, wiring lines are broken or become thin, the reflectivity falls, and other problems are caused.

(9) The invention is also a process for producing a transparent electroconductive film by use of the sputtering target according to any one of the items (1) to (5), comprising the step of using the sputtering target to form the transparent electroconductive film by sputtering, and the step of heating the formed transparent electroconductive film in a temperature range of 200 to 250° C., thereby crystallizing the film.

The action that the film is heated after formed, whereby the film is crystallized is as described above. Such a structure makes it possible to yield the above-mentioned transparent electroconductive film.

Advantageous Effects of the Invention

As described above, according to the invention, a transparent electroconductive film is obtained which constitutes a transparent electrode wherein residues or the like are not generated by etching with a weak acid (such as an organic acid). Moreover, a sputtering target for producing such a transparent electroconductive film is obtained.

According to the invention, a transparent electroconductive film is obtained which constitutes a transparent electrode having resistance against an etchant for a reflective electrode when the reflective electrode over the transparent electrode is etched. Moreover, a sputtering target for producing such a transparent electroconductive film is obtained.

According to the invention, a transparent electroconductive film is obtained which constitutes a transparent electrode capable of restraining cell reaction resulting from a matter that the transparent electrode is electrically connected to a reflective electrode when the reflective electrode over the transparent electrode is etched. A sputtering target for producing such a transparent electroconductive film is obtained.

Furthermore, a transparent electroconductive film producing process capable of producing the above-mentioned transparent electroconductive film is obtained.

BRIEF DESCRIPTION OF THE DRAWINGS

FIG. 1 It is a diagram of a table showing the examples 1 to 3, and Comparative Examples 1 to 3.

BEST MODE FOR CARRYING OUT THE INVENTION

Example 1

$In_2O_3$ powder having an average particle diameter of 1 μm or less and $CeO_2$ powder having an average particle diameter of 1 μm or less were formulated to set the atom number ratio of cerium/indium to 0.012, and the resultant was put into a pot made of a resin. Furthermore, pure water was added thereto, and the components were subjected to wet ball mill mixing, using a hard $ZrO_2$ ball mill. The mixing time was set to 20 hours.

As a result of the mixing, the resultant mixed slurry was taken out, filtrated, dried and granulated. The thus-obtained granulated product was shaped by cold isostatic press under an applied pressure of 294 MPa (3 t/cm$^2$).

Next, the shaped body was sintered as follows:

First, in a sintering furnace, prepared was an atmosphere wherein oxygen was being introduced at a rate of 5 L/min. per 0.1 m$^3$ of the volume of the furnace. Under this atmosphere, the shaped body was sintered at 1450° C. for 8 hours. At this time, the temperature was raised at 1° C./min. up to 1000° C., and then raised at 2° C./min. from 1000 to 145° C. Thereafter, the introduction of oxygen was stopped, and the temperature was lowered at 5° C./min. from 1450 to 1300° C. In an atmosphere wherein argon gas was being introduced at a rate of 10 L/min. per 0.1 m$^3$ of the furnace volume, the temperature of 1300° C. was kept for 3 hours. Thereafter, the shaped body was naturally cooled. This gave a cerium-containing $In_2O_3$ sintered body having a bulk resistance of 0.95 mΩcm and a density of 6.6 g/cc or more. A sputtering face of this sintered body was polished with a cup grindstone, and the body was worked into a diameter of 100 mm and a thickness of 5 mm. An indium-based alloy was used to stick a backing plate to the sintered body to produce a sintered body target.

In the example, an important matter is that cerium is dispersed in the sputtering target. It is particularly preferred that indium sites of indium oxide undergo substitution with/solid-solution of one part of the cerium atoms, and the other parts of the cerium atoms are in the form of a simple substance of cerium oxide.

In other words, about forms that the cerium is contained in the sputtering target, the following two forms are present: a form of a portion wherein the indium oxide sites undergo substitution with/solid-solution of the cerium atoms; and a form of a portion wherein the cerium atoms are present as a simple substance of cerium oxide. Such a presence of cerium oxide can be identified by X-tray diffraction. The size of the particles of cerium oxide present as a simple substance can be checked with an EPMA (electron probe micro analyzer). The diameter of the crystal particles dispersed in this manner was 2.8 μm. This diameter was obtained by image processing.

The matter that the presence of cerium oxide can be identified by X-ray diffraction as described above is equal to the matter that a peak originating from cerium oxide can be observed. Since the sputtering target of the example contains indium oxide, a peak originating from indium oxide is naturally observed according to X-ray diffraction. Accordingly, about the sputtering target of the example, peaks originating from indium oxide and cerium oxide are observed according to X-ray diffraction.

In the case where all of indium sites of indium oxide undergo substitution with/solid-solution of cerium atoms, the case being different from the example, the crystal grain sizes of indium oxide itself in the indium oxide sintered body may grow abnormally (into a size of more than 5 μm). Thus, in sputtering, electric discharge may become unstable, and a transparent electroconductive film to be obtained may not be stably produced with ease.

Returning to the example, the resultant sputtering target was put into a DC magnetron sputtering target apparatus, and this was used to form a transparent thin film having a thickness of 70 nm on a glass substrate the temperature of which was kept at 150° C. The light transmittance of the thus-obtained glass substrate with the thin film to light having a wavelength of 550 nm was measured. The resultant light transmittance was 91%. The specific resistance of the thin film was 360 μΩcm. The potential of this thin film to a Ag/AgCl standard electrode was measured. The potential was 0.38 V. Furthermore, X-ray diffraction was performed. As a result, no peak was observed, and thus it was demonstrated that the thin film was amorphous.

This substrate was subjected to thermal treatment at 230° C. for 30 minutes, and then subjected to X-ray analysis. As a result, only a peak originating from indium was observed, and thus it was demonstrated that it was crystallized. The standard electrode potential of this crystalline thin film was 0.36V, and the specific resistance thereof was 220 μΩcm. This substrate was subjected to XPS measurement, so as to observe the valence of the cerium atoms. As a result, positive trivalent cerium was observed.

The abundance of the positive trivalent cerium, that is, $[Ce^{+3}]/([Ce^{+3}]+[Ce^{+4}])$, which was obtained from peak separating treatment and area ratio, was 0.15. Herein, $[Ce^{+3}]$ represents the number of the trivalent cerium atoms per unit volume/unit mass in the sample, and [Ce$^{+4}$] represents the number of the positive quadrivalent cerium atoms in the same unit.

Next, a glass substrate was set into the same DC magnetron sputtering apparatus in the same way, so as to form a transparent electroconductive film having a thickness of 60 nm. The thus-obtained glass substrate with the thin film was patterned by photoetching. At this time, three kinds of etching solutions were used to attempt to perform the patterning. The three kinds of etching solutions were a solution of oxalic acid (3.4% by weight) in water, a mixed acid of phosphoric acid, acetic acid and nitric acid, and an aqueous solution containing a cerium ammonium nitrate. In the case of using any one of the etching solutions, no generation of residues was observed.

The resultant glass substrate having the patterned electrode (transparent electrode) was subjected to thermal treatment at 230° C. for 30 minutes. Thereafter, Al was formed into a film of 300 nm film thickness on this glass substrate. This Al film was patterned using a photo-mask having a different pattern. After the patterning, an etching solution was used to perform etching (that is, photoetching). The etching solution used in this photoetching was a mixed solution of phosphoric acid, acetic acid and nitric acid. After the etching, the section of the transparent electrode was observed under an electron microscope; the section was not damaged. In the Al electrode formed by the above-mentioned patterning also, pinholes, line-thinning, line-breaking, and the like were not observed.

The contents of the example 1 are shown in FIG. 1, together with other Examples and other Comparative Examples.

Next, a glass substrate was again set into the above-mentioned DC sputtering apparatus, so as to form a transparent electroconductive film having a thickness of 60 nm. The thus-obtained glass substrate with the thin film was patterned by photoetching. As etching solutions, the following three kings were used: a solution of oxalic acid (3.4% by weight) in water, a mixed acid of phosphoric acid, acetic acid and nitric acid, and an aqueous solution containing a cerium ammonium nitrate. In the case of using any one of the solutions, no generation of residues was observed.

The thus-obtained glass substrate having the patterned electrode was subjected to thermal treatment at 230° C. for 30 minutes. Thereafter, Al was formed into a film of 300 nm film thickness on this glass substrate. This Al film corresponds to a reflective electrode over a transparent electrode in an actual electrode substrate.

This Al film was patterned using a photo-mask having a different pattern, and then etching (that is, photoetching) was performed. The etching solution used therefor was a mixed solution of phosphoric acid, acetic acid and nitric acid.

Thereafter, the section of the transparent electroconductive film (which may also be referred to as a transparent electrode in an actual electrode substrate) was observed under an electron microscope; the section was not damaged. In the Al film, which may be called an Al electrode or a reflective electrode in an actual electrode substrate, pinholes, line-thinning, line-breaking, and the like were not observed. The contents of the example 2 are shown in FIG. 1, together with other Examples and other Comparative Examples.

Example 2

In the example 2, the same processing and operations as in above Example 1 were performed except that the ratio between the number of cerium atoms and that of indium atoms ((the number of cerium atoms)/(that of indium atoms)) per unit volume or unit mass was set to 0.035.

As a result of this processing, a cerium-containing In$_2$O$_3$ sintered body wherein the bulk resistance was 0.84 mΩcm, and the density was a value of 6.8 g/cc or more was obtained. The presence of cerium oxide in the sintered body could be ascertained by X-ray diffraction. The size of particles of cerium oxide that was present as a simple substance could be ascertained also with an EPMA. Cerium oxide was dispersed and contained in this manner, whereby the diameter of the crystal grains was 2.4 μm. This diameter was obtained by image processing. This sputtering target was used to form a transparent thin film having a thickness of 70 μm.

The light transmittance of the thus-obtained glass substrate with the thin film to light having a wavelength of 550 nm was measured. The light transmittance was 90%. The specific resistance of the thin film was 330 μΩcm. The potential of this thin film to a Ag/AgCl standard electrode was measured. The potential was 0.36V. Furthermore, X-ray diffraction was measured. As a result, no peak was observed, and thus it was demonstrated that the thin film was amorphous. This substrate was subjected to thermal treatment at 230° C. for 30 minutes, and then subjected to X-ray diffraction. As a result, only a peak originating from indium was observed, and thus it was demonstrated that it was crystallized.

The standard electrode potential of this crystalline thin film was 0.35 V, and the specific resistance thereof was 210 μΩcm. This substrate was subjected to XPS measurement, so as to observe the valence of the cerium atoms. As a result, positive trivalent cerium was observed. The abundance of the positive trivalent cerium was 0.24.

Example 3

In the example 3, the same processing and operations as in above Example 1 were performed except that the ratio between the number of cerium atoms and that of indium atoms ((the number of cerium atoms)/(that of indium atoms)) per unit volume or unit mass was set to 0.07.

As a result of this processing, a cerium-containing In$_2$O$_3$ sintered body wherein the bulk resistance was 0.82 mΩcm, and the density was a value of 6.9 g/cc or more was obtained. The presence of cerium oxide in the sintered body could be ascertained by X-ray diffraction. The size of particles of cerium oxide that was present as a simple substance could be ascertained also with an EPMA. Cerium oxide was dispersed and contained in this manner, whereby the diameter of the crystal grains was 4.8 μm. This diameter was obtained by image processing. This sputtering target was used to form a transparent thin film having a thickness of 70 μm.

The light transmittance of the thus-obtained glass substrate with the thin film to light having a wavelength of 550 nm was measured. The light transmittance was 89%. The specific resistance of the thin film was 380 μΩcm. The potential of this thin film to a Ag/AgCl standard electrode was measured. The potential was 0.37 V. Furthermore, X-ray diffraction was measured. As a result, no peak was observed, and thus it was demonstrated that the thin film was amorphous. This substrate was subjected to thermal treatment at 230° C. for 30 minutes, and then subjected to X-ray diffraction. As a result, only a peak originating from indium was observed, and thus it was demonstrated that it was crystallized.

The standard electrode potential of this crystalline thin film was 0.38 V, and the specific resistance thereof was 250 μΩcm. This substrate was subjected to XPS measurement, so as to observe the valence of the cerium atoms. As a result, positive trivalent cerium was observed. The abundance of this positive trivalent cerium was 0.36.

Next, a glass substrate was again set into the above-mentioned sputtering apparatus, so as to form a transparent electroconductive film having a thickness of 60 nm. The thus-obtained glass substrate with the thin film was patterned by photoetching. As etching solutions, the following three kings were used: a solution of oxalic acid (3.4% by weight) in water, a mixed acid of phosphoric acid, acetic acid and nitric acid, and an aqueous solution containing a cerium ammonium nitrate. In the case of using any one of the solutions, no generation of residues was observed.

The thus-obtained glass substrate having the patterned electrode was subjected to thermal treatment at 230° C. for 30 minutes. Thereafter, Al was formed into a film of 300 nm film thickness on this glass substrate. This Al film corresponds to a reflective electrode over a transparent electrode in an actual electrode substrate.

This Al film was patterned using a photo-mask having a different pattern, and then etching (that is, photoetching) was performed. The etching solution used therefor was a mixed solution of phosphoric acid, acetic acid and nitric acid.

Thereafter, the section of the transparent electroconductive film (which may also be referred to as a transparent electrode in an actual electrode substrate) was observed under an electron microscope; the section was not damaged. In the Al film, which may be called an Al electrode or a reflective electrode in an actual electrode substrate, pinholes, line-thinning, line-breaking, and the like were not observed.

The contents of the example 3 are shown in FIG. 1, together with the above-mentioned individual Examples and Comparative Examples that will be described below.

Comparative Example 1

In the Comparative Example 1, the same processing and operations as in above Examples 1 to 3 were performed except that the ratio between the number of cerium atoms and that of indium atoms ((the number of cerium atoms)/(that of indium atoms)) per unit volume or unit mass was set to 0.0005.

As a result of this processing, a cerium-containing $In_2O_3$ sintered body wherein the bulk resistance was 10.5 mΩcm, and the density was a value of 6.4 g/cc or more was obtained. The presence of cerium oxide in the sintered body could not be ascertained by X-ray diffraction. The size of particles of cerium oxide that was present as a simple substance could not be ascertained also with an EPMA. That is to say, the diameter of the crystal grains could not be obtained. This sputtering target was used to form a transparent thin film having a thickness of 70 nm.

The light transmittance of the thus-obtained glass substrate with the thin film to light having a wavelength of 550 nm was measured. The light transmittance was 89%. The specific resistance of the thin film was 450 μΩcm. The potential of this thin film to a Ag/AgCl standard electrode was measured. The potential was 0.80V. Furthermore, X-ray diffraction was measured. As a result, small peaks were observed, and thus the film was microcrystalline. This substrate was subjected to thermal treatment at 230° C. for 30 minutes, and then subjected to X-ray diffraction. As a result, only a peak originating from indium was observed, and thus it was demonstrated that it was crystallized.

The standard electrode potential of this crystalline thin film was 0.86 V, and the specific resistance thereof was 870 μΩcm. This substrate was subjected to XPS measurement, so as to observe the valence of the cerium atoms. As a result, no positive trivalent cerium was observed.

Next, a glass substrate was again set into the above-mentioned sputtering apparatus, so as to form a transparent electroconductive film having a thickness of 60 nm. The thus-obtained glass substrate with the thin film was patterned by photoetching. As etching solutions, the following three kings were used: a solution of oxalic acid (3.4% by weight) in water, a mixed acid of phosphoric acid, acetic acid and nitric acid, and an aqueous solution containing a cerium ammonium nitrate. In the case of using any one of the solutions, the generation of residues was observed.

The thus-obtained glass substrate having the patterned electrode was subjected to thermal treatment at 230° C. for 30 minutes. Thereafter, Al was formed into a film of 300 nm film thickness on this glass substrate. This Al film corresponds to a reflective electrode over a transparent electrode in an actual electrode substrate.

This Al film was patterned using a photo-mask having a different pattern, and then etching (that is, photoetching) was performed. The etching solution used therefor was a mixed solution of phosphoric acid, acetic acid and nitric acid.

Thereafter, the section of the transparent electroconductive film (which may also be referred to as a transparent electrode in an actual electrode substrate) was observed under an electron microscope; it was made evident that a part of the section was dissolved so as to be damaged. In the Al film, which may be called an Al electrode or a reflective electrode in an actual electrode substrate, pinholes were partially observed, and line-thinning and line-breaking were locally observed.

The contents of the Comparative Example 1 are shown in FIG. 1, together with the above-mentioned individual Examples and other Comparative Examples.

Comparative Example 2

In the Comparative Example 2, the same processing and operations as in above Examples 1 to 3 were performed except that the ratio between the number of cerium atoms and that of indium atoms ((the number of cerium atoms)/(that of indium atoms)) per unit volume or unit mass was set to 0.18.

As a result of this processing, a cerium-containing $In_2O_3$ sintered body wherein the bulk resistance was 8.35 mΩcm, and the density was a value of 7.0 g/cc or more was obtained. The presence of cerium oxide in the sintered body could be ascertained by X-ray diffraction. The size of particles of cerium oxide that was present as a simple substance could be ascertained also with an EPMA. It was however difficult that the diameter of the crystal grains obtained by image processing was determined. A continuous phase could also be ascertained. This sputtering target was used to form a transparent thin film having a thickness of 70 nm.

The light transmittance of the thus-obtained glass substrate with the thin film to light having a wavelength of 550 nm was measured. The light transmittance was 87%. The specific resistance of the thin film was 1250 μΩcm. The potential of this thin film to a Ag/AgCl standard electrode was measured. The potential was 0.7 V. Furthermore, X-ray diffraction was measured. As a result, no peak was observed, and thus the film was amorphous. This substrate was subjected to thermal treatment at 230° C. for 30 minutes, and then subjected to X-ray diffraction. As a result, no peak originating from indium was observed, and thus it was demonstrated that it was not crystallized.

The standard electrode potential of this amorphous thin film was 0.76 V, and the specific resistance thereof was 1860 μΩcm. This substrate was subjected to XPS measurement, so as to observe the valence of the cerium atoms. As a result, no positive trivalent cerium was observed, and it was determined that almost all of the observed cerium atoms were positive quadrivalent cerium.

Next, a glass substrate was again set into the above-mentioned sputtering apparatus, so as to form a transparent electroconductive film having a thickness of 60 nm. The thus-obtained glass substrate with the thin film was patterned by photoetching. As etching solutions, the following three kings were used: a solution of oxalic acid (3.4% by weight) in water, a mixed acid of phosphoric acid, acetic acid and nitric acid, and an aqueous solution containing a cerium ammonium nitrate. In the case of using any one of the solutions, no generation of residues was observed.

The thus-obtained glass substrate having the patterned electrode was subjected to thermal treatment at 230° C. for 30 minutes. Thereafter, Al was formed into a film of 300 nm film thickness on this substrate. This Al film corresponds to a reflective electrode over a transparent electrode in an actual electrode substrate.

This Al film was patterned using a photo-mask having a different pattern, and then etching (that is, photoetching) was performed. The etching solution used therefor was a mixed solution of phosphoric acid, acetic acid and nitric acid.

Thereafter, the section of the transparent electroconductive film (which may also be referred to as a transparent electrode in an actual electrode substrate) was observed under an electron microscope; it was made evident that almost all of the area thereof was dissolved so as to be damaged. In the Al film, which may be called an Al electrode or a reflective electrode in an actual electrode substrate, pinholes were partially observed, and line-thinning and line-breaking were locally observed.

The contents of the Comparative Example 2 are shown in FIG. 1, together with the above-mentioned individual Examples and other Comparative Examples.

Comparative Example 3

In the Comparative Example 3, which is different from above Examples 1 to 3, tin was used instead of cerium. Furthermore, in the Comparative Example 3, the same processing and operations as in above Examples 1 to 3 were performed except that the ratio between the number of tin atoms and that of indium atoms ((the number of tin atoms)/(that of indium atoms)) per unit volume or unit mass was set to 0.10.

As a result of this processing, a tin-containing $In_2O_3$ sintered body wherein the bulk resistance was 0.35 mΩcm, and the density was a value of 6.8 g/cc or more was obtained. The presence of tin oxide in the sintered body could not be ascertained by X-ray diffraction. The size of particles of tin oxide that was present as a simple substance could not be ascertained also with an EPMA, either. Thus, they were uniformly dispersed. This sputtering target was used to form a transparent thin film having a thickness of 70 nm.

The light transmittance of the thus-obtained glass substrate with the thin film to light having a wavelength of 550 nm was measured. The light transmittance was 90%. The specific resistance of the thin film was 230 μΩcm. The potential of this thin film to a Ag/AgCl standard electrode was measured. The potential was 0.83V. Furthermore, X-ray diffraction was measured. As a result, small peaks were observed, and thus the film was microcrystalline. This substrate was subjected to thermal treatment at 230° C. for 30 minutes, and then subjected to X-ray diffraction. As a result, a peak originating from indium was observed, and thus it was demonstrated that it was crystallized.

The standard electrode potential of this crystalline thin film was 0.86 V, and the specific resistance thereof was 180 μΩcm.

Next, a glass substrate was again set into the above-mentioned sputtering apparatus, so as to form a transparent electroconductive film having a thickness of 60 nm. The thus-obtained glass substrate with the thin film was patterned by photoetching. As etching solutions, the following three kings were used: a solution of oxalic acid (3.4% by weight) in water, a mixed acid of phosphoric acid, acetic acid and nitric acid, and an aqueous solution containing a cerium ammonium nitrate. In the case of using any one of the solutions, the generation of residues was observed.

The thus-obtained glass substrate having the patterned electrode was subjected to thermal treatment at 230° C. for 30 minutes. Thereafter, Al was formed into a film of 300 nm film thickness on this substrate. This Al film corresponds to a reflective electrode over a transparent electrode in an actual electrode substrate.

This Al film was patterned using a photo-mask having a different pattern, and then etching (that is, photoetching) was performed. The etching solution used therefor was a mixed solution of phosphoric acid, acetic acid and nitric acid.

Thereafter, the section of the transparent electroconductive film (which may also be referred to as a transparent electrode in an actual electrode substrate) was observed under an electron microscope. A portion thereof was a portion low in transparency. Thus, it was made evident that the section was damaged. In the Al film, which may be called an Al electrode or a reflective electrode in an actual electrode substrate, pinholes were partially observed.

The contents of the Comparative Example 3 are shown in FIG. 1, together with the above-mentioned individual Examples and the other Comparative Examples.

CONCLUSION

As described above, according to the embodiment, there is obtained a transparent electroconductive film which constitutes a transparent electrode having a useful nature that residues and so on are not generated by etching with a weak acid (such as an organic acid), and other useful natures. The embodiment can be used in various electrode substrates. It is preferred to apply the embodiment to various substrates which constitute liquid crystal display devices, in particular, an electrode substrate used in a semi-transmissible and semi-reflective liquid crystal display device. Furthermore, it is also preferred to use the embodiment in an electrode substrate used in an EL display device or the like. Besides, the invention can be used in various fields wherein transparent electroconductive films known in the prior art are used.

The invention claimed is:

1. A sputtering target comprising indium oxide and positive trivalent cerium oxide, wherein [Ce]/([In]+[Ce])=0.005 to 0.035 wherein [Ce] represents the number of the atoms of cerium per unit weight/unit mass, and [In] represents the number of the atoms of indium per unit weight/unit mass, and wherein the abundance of trivalent cerium $[Ce^{+3}]/([Ce^{+3}]+[Ce^{+4}])$ is 0.01 to 0.6, wherein when its crystal peaks are observed by X-ray diffraction, the presence of peaks originating from indium oxide and cerium oxide is observed, and
  further when EPMA measurement is performed, the measured diameter of particles of cerium oxide dispersed in indium oxide is 5 μm or less.

2. The sputtering target according to claim 1, wherein when the EPMA measurement is performed, the presence of the cerium oxide particles, which are cerium oxide particles, dispersed in indium oxide and having a diameter of 1 μm or more is observed.

3. The sputtering target according to claim 1, comprising indium oxide and cerium oxide, and having a density of 6.6 g/cc or more and a bulk resistance of 1 mΩcm or less.

\* \* \* \* \*